(12) United States Patent
Yen et al.

(10) Patent No.: US 7,438,947 B2
(45) Date of Patent: Oct. 21, 2008

(54) COLOR FILTER PROCESS

(75) Inventors: Tan-Ching Yen, Hsinchu (TW);
Chi-Ming Cheng, Tainan (TW);
Kuang-Lung Kuo, Jhongli (TW)

(73) Assignee: TPO Displays Corp., Chu-Nan (TW)

( * ) Notice: Subject to any disclaimer, the term of this patent is extended or adjusted under 35 U.S.C. 154(b) by 777 days.

(21) Appl. No.: 11/001,195

(22) Filed: Nov. 30, 2004

(65) Prior Publication Data

US 2006/0114377 A1    Jun. 1, 2006

(51) Int. Cl.
*G02B 5/20* (2006.01)
*G02F 1/1335* (2006.01)
(52) U.S. Cl. .................. 427/162; 427/164; 427/264
(58) Field of Classification Search ........... None
See application file for complete search history.

(56) References Cited

U.S. PATENT DOCUMENTS

2004/0229140 A1 * 11/2004 Kim ........................... 430/7
2004/0266307 A1 * 12/2004 McCoy et al. ............... 445/24

FOREIGN PATENT DOCUMENTS

JP     5-066306 A   *   3/1993

* cited by examiner

*Primary Examiner*—John A. McPherson
(74) *Attorney, Agent, or Firm*—Liu & Liu

(57) ABSTRACT

A process for fabricating a color filter. An imprint mask accompanied by a dry etching step is used to replace the conventional wet development process. The present invention attains the advantages of increased pattern uniformity of color elements, improved film flatness of color elements, increased resolution, reduced process time, reduced process cost, and elimination of the use of developing solvent to reduce waste treatment and environmental impact.

17 Claims, 9 Drawing Sheets

COLOR FILTER PROCESS

BACKGROUND OF THE INVENTION

1. Field of the Invention

The present invention relates to a process for fabricating a color filter, and more particularly to a process for fabricating a color element of the color filter.

2. Description of the Related Art

Color filters (CF) have been popularly employed in video products, such as color liquid crystal displays, charge coupled devices, and scanners, to obtain ample color information. With regard to a liquid crystal display (LCD) with light, thin, power-saving and full color features, a color filter with three primary colors including red (R), green (G) and blue (B) elements is required for dividing a pixel into R, G and B subpixels. The three primary colors are blended with each other in proportion to create various colors, thus enabling the LCD to display bright, realistic and vivid pictures, enhancing functionality of the LCD.

In a conventional CF process, thin-film color layers including R, G and B layers are successively coated on a glass substrate to serve as R, G and B elements, which must then be precisely aligned to pixel areas on the TFT array substrate. In view of manufacturing costs and quality requirements, dyeing, pigment dispersion, printing and electroplating are commonly used to form the R, G and B elements of the color filter. Pigment dispersion which provides the color filter with high precision and superior light-resistance and heat-resistance has become a major process in recent TFT-type color filter technologies.

The pigment dispersion method applied in the conventional color filter process includes the following steps. A black photosensitive resin material is spin-coated on a glass substrate, and then subjected to a photolithography process, that is, exposed to light, developed and baked, to form a black matrix (BM) having an array of openings for color elements. Then, red, green, and blue resin materials are respectively spin-coated and subjected to the photolithography process to form three different color elements, such that the red, green, and blue elements fill the opening of the black matrix in a desired arrangement. As mentioned above, the pigment dispersion method includes resin coating, exposure, and development procedures. Thus, any inaccuracy in these processes would cause the color elements have inferior color uniformity and resolution, and inaccurate alignment.

In addition, the photolithography process is a wet etching process, which defines the pattern by means of the chemical dissolution between the chemical solution and the resin material. Therefore, the development effect is easily varied by the concentration of the chemical solution, which in turn affects pattern uniformity and film flatness. In addition, equipment cost for photolithography is very expensive and the process time is long, hence it does not meet requirements for mass production. Further, the use of developer requires subsequent waste treatment. Additionally, solvent evaporation is detrimental to environment and the humans alike.

SUMMARY OF THE INVENTION

The present invention is to solve the above-mentioned problems and provide an efficient process for fabricating a color filter. In one aspect of the present invention, openings in various layers, (e.g., light shielding layer, color material layer) are created by stamping using an imprint mask. The present invention uses an imprint mask and a dry etching process to replace the conventional wet development process, thus increasing the pattern uniformity and the film flatness of the color elements.

The process for fabricating a color filter according to one embodiment of the present invention includes the following steps. In step 1, a material layer, that is a light-shielding layer or a color layer, is formed on a substrate. In step 2, a mask is provided, the mask including at least one recess region and at least one protrusion region on its surface. The surface of the mask is imprinted onto the material layer, such that the material layer forms an array of openings including a first region with a greater thickness and a second region with a smaller thickness. The first region corresponds to the recess region and the second region corresponds to the protrusion region. In step 3, a dry etching process is performed to remove the second region of the material layer, leaving the first region of the material layer to form a light-shielding element or a color element on the substrate. Steps 1 to 3 can be repeated to form another light-shielding element or color element. Steps 1 to 3 can be repeated several times according to practical requirements to complete a color filter.

The present invention also provides a process for fabricating a color filter, in which during the final color element is formed, the imprinting step is omitted and the dry etching step is replaced by a polishing step.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

Figure 1A:
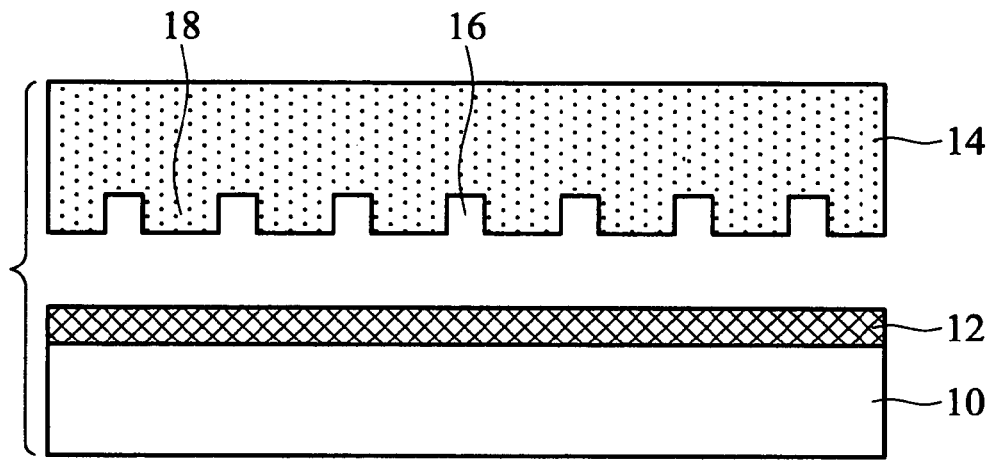
FIGS. 1A to 1C are cross-sections illustrating the process flow of a black matrix according to the first embodiment of the present invention.

The following description is of the best-contemplated mode of carrying out the invention. This description is given for the purpose of illustrating the general principles of the invention and should not be taken in a limiting sense. The scope of the invention is best determined by reference to the appended claims.

It is noted that the description hereinbelow refers to various layers arranged on, above or overlying other layers, to describe the relative positions of the various layers. References to "on", "above", "overlying", or other similar languages, are not limited to the interpretation of one layer being immediately adjacent another layer. There may be intermediate or interposing layers, coatings, or other structures present, and associated process steps present, which are not shown or discussed herein, but could be included without departing from the scope and spirit of the invention disclosed herein. Similar, references to structures adjacent, between or other positional references to other structures merely describe the relative positions of the structures, with or without intermediate structures.

The present invention provides a process for fabricating a color filter, which uses an imprint mask accompanied by a dry etching step to replace the conventional wet development process. The present invention attains the advantages of increased pattern uniformity of color elements, improved film flatness of color elements, increased resolution, reduced process time, reduced process cost, and elimination of the use of developing solvent to reduce waste treatment and environmental impact.

The color filter process of the present invention fabricates a color element on a glass substrate to serve as a color filter substrate, facing a TFT (thin film transistor) array substrate, for a liquid crystal display (LCD). This color filter process includes the fabrication of a black matrix and three kinds of color elements. Alternatively, a color element can be fabricated on a TFT array substrate for a LCD, referred to as a COA (color filter on array) technique. This color filter process only includes three kinds of color elements and the black matrix is omitted to meet the design requirements and also to reduce production cost. The arrangement of the three kinds of color elements is not limited. For example, the arrangement can be strip type, mosaic type, or delta type.

The following embodiments are intended to illustrate the process and the advantages of the present invention without limiting its scope, since numerous modifications and variations will be apparent to those skilled in the art.

First Embodiment

The color filter process of the first embodiment of the present invention includes fabrication of filter elements that includes a light shielding element (e.g., a black matrix) and color elements (e.g., three kinds of color elements). FIGS. 1 to 4 are cross-sections illustrating the process flow of fabricating the color filter of the first embodiment of the present invention.

Figure 1B:
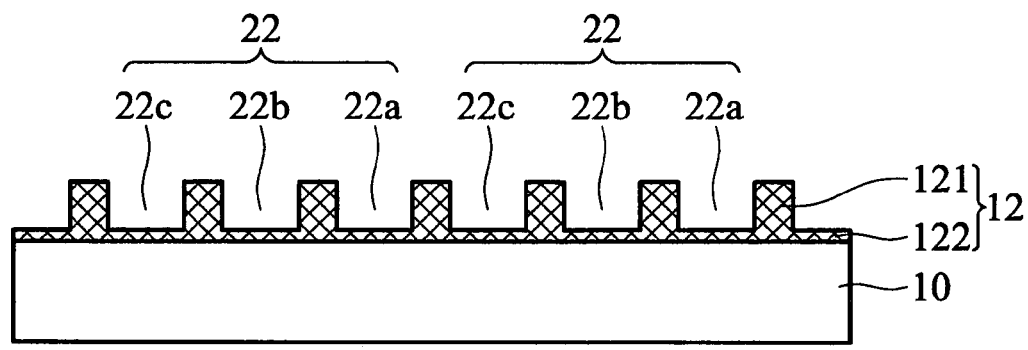
Figure 1C:
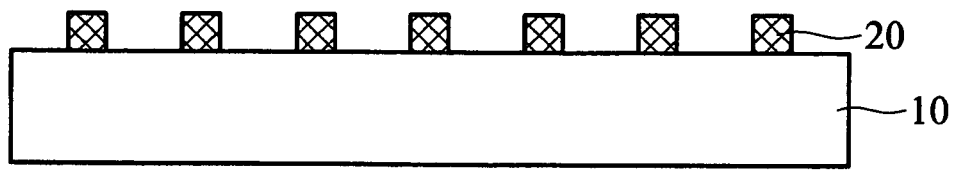

FIGS. 1A to 1C are cross-sections illustrating the process flow of fabricating a black matrix of the first embodiment of the present invention. Referring to FIG. 1A, a substrate 10 is provided, which may be one of a transparent insulating substrate, a glass substrate, a color filter substrate or a TFT (thin film transistor) array substrate applied in a liquid crystal display. Then, a first filter element layer comprising a light-shielding material layer 12, such as a black resin material, is uniformly coated on the entire surface of the substrate 10 by spin-coating or other applicable coating method. A first imprint mask 14 is provided, which includes a black matrix pattern on its imprint surface. The black matrix pattern is constituted by a planar array of a plurality of indentations or recess regions 16 and a plurality of protrusion regions 18. The first imprint mask 14 can be formed by subjecting a quartz board to electron beam direct writing or by subjecting a metal board to mechanical processing.

Subsequently, the imprint surface of the first imprint mask 14 is stamped or presses downwardly onto the light-shielding layer 12, to imprint indentations in the layer 12, such that the light-shielding layer 12 forms two regions with different thicknesses. Referring to FIG. 1B, the first region 121 with a greater thickness corresponds to the recess region 16, and the second region 122 with a smaller thickness corresponds to the protrusion region 18. The first regions 121 define a plurality of opening groups 22 and each opening group 22 includes first, second and third openings 22a, 22b and 22c. The first opening 22a corresponds to a place for a first color element to be formed, the second opening 22b corresponds to a place for a second color element to be formed, and the third opening 22c corresponds to a place for a third color element to be formed.

Finally, a first dry etching process is performed to remove the second regions 122 of the light-shielding layer 12 in the first, second and third openings 22a, 22b and 22c until the substrate 10 is exposed. This procedure simultaneously removes the top portions of the first regions 121 of the light-shielding material 12. Thus, the remaining first regions 121 constitute light-shielding elements (a black matrix) 20 as shown in FIG. 1C. The operation conditions of the first dry etching are: $O_3$ plasma ashing, the etching time is 50-70 sec, the etching thickness is about 0.3-0.5 μm, the thickness of the light-shielding elements 20 are 0.8 to 3.5 μm.

Figure 2A:
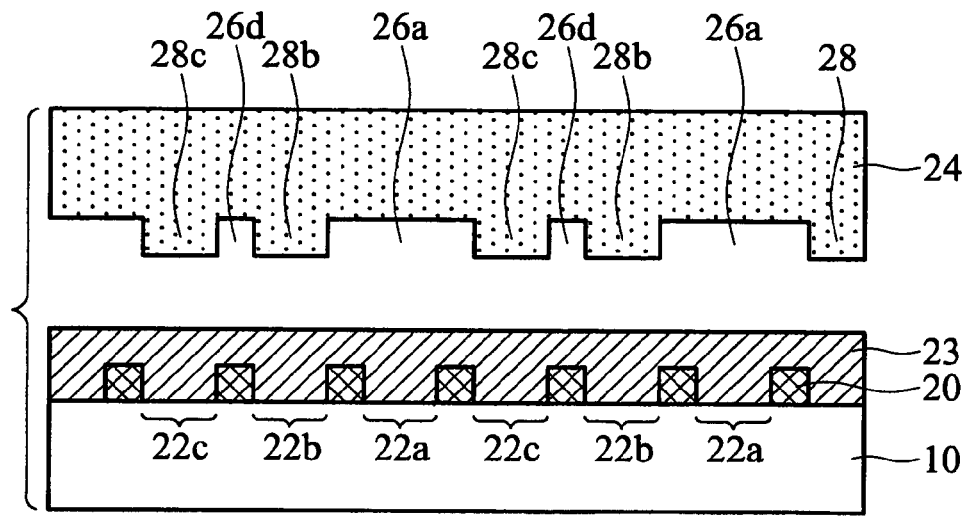
FIGS. 2A to 2C are cross-sections illustrating the process flow of first color elements according to the first embodiment of the present invention.
Figure 2B:
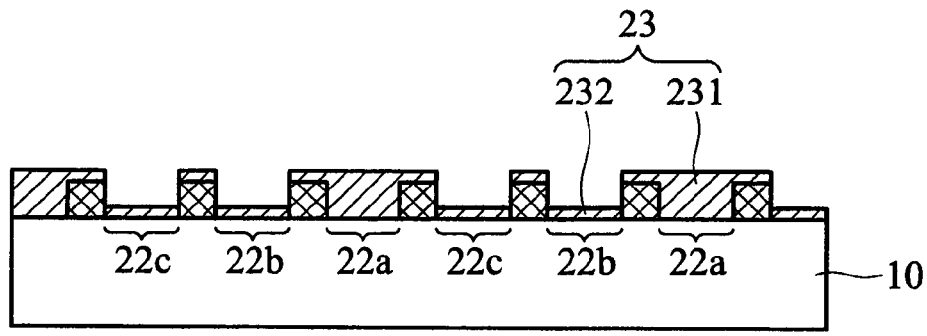
Figure 2C:
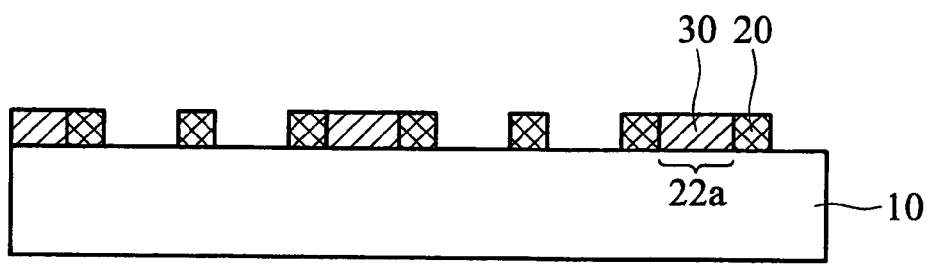

FIGS. 2A to 2C are cross-sections illustrating the process flow of fabricating first color elements of the first embodiment of the present invention. Referring to FIG. 2A, a second filter element layer comprising a first color layer 23, such as a red resin material, is uniformly coated on the entire surface of the substrate 10 by spin-coating or other applicable coating method, so as to cover the light-shielding elements 20 and fill the first, second and third openings 22a, 22b and 22c. A second imprint mask 24 is provided, which includes a first color element pattern on its imprint surface. The first color element pattern is constituted by a plurality of recess regions 26a and 26d and a plurality of protrusion regions 28b and 28c. The first recess regions 26a corresponds to the first opening 22a and its adjacent light-shielding elements 20, the first protrusion region 28b corresponds to the second opening 22b, the second protrusion region 28c corresponds to the third opening 22c, and the second recess region 26d corresponds to the light-shielding element 20 between the second and third openings 22b and 22c.

Subsequently, the imprint surface of the second imprint mask 24 is imprinted downwardly onto the first color 23, such that the first color 23 forms two regions with different thicknesses. Referring to FIG. 2B, the first region 231 with a greater thickness corresponds to the first recess region 26a and fills the first opening 22a. The second region 232 with a smaller thickness corresponds to the first and second protrusion regions 28b and 28c and is disposed in the second and third openings 22b and 22c.

Finally, a second dry etching process is performed to remove the second regions 232 of the first color layer 23 in the second and third openings 22b and 22c until the substrate 10 is exposed. This procedure simultaneously removes the top portion of the first color layer 23 in the first regions 231 and on the light-shielding elements 20. Thus, the first regions 231 remaining in the first openings 22a constitute first color elements 30 as shown in FIG. 2C. In the second dry etching, the etching stop point can be designed according to the brightness of the first color elements 30 and the light-shielding element 20. The preferable operation conditions are: $O_3$ plasma ashing, the etching time is 50-70 sec, the etching thickness is about 0.3-0.5 μm, the thickness of the first color elements 30 are 0.8 to 3.5 μm.

Figure 3A:
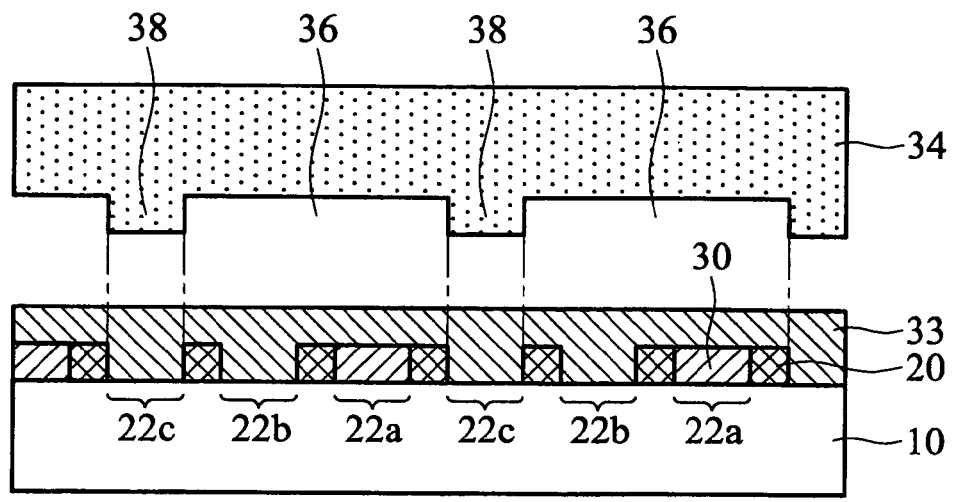
FIGS. 3A to 3C are cross-sections illustrating the process flow of second color elements according to the first embodiment of the present invention.
Figure 3B:
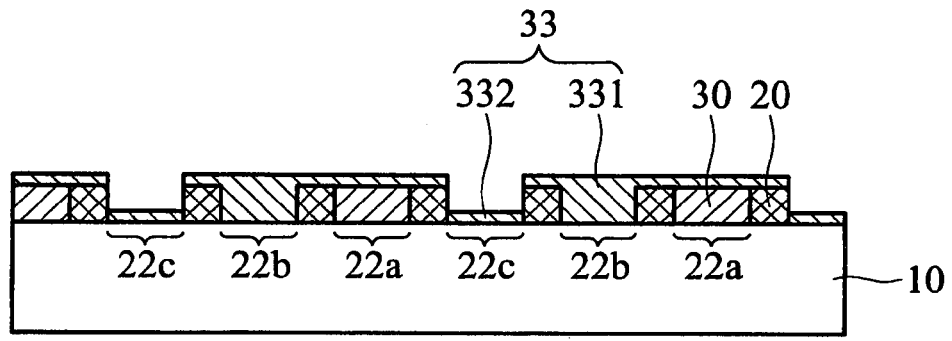
Figure 3C:
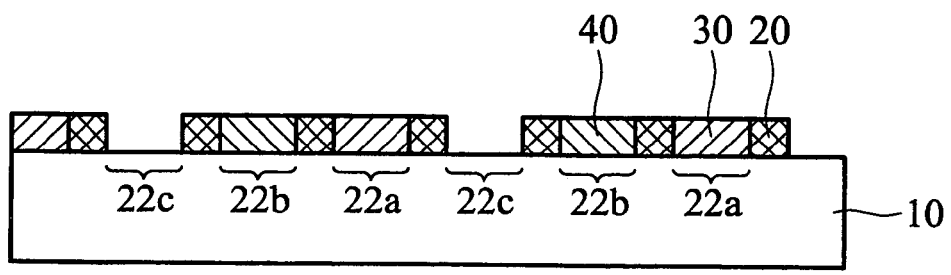

FIGS. 3A to 3C are cross-sections illustrating the process flow of fabricating second color elements of the first embodiment of the present invention. Referring to FIG. 3A, a third filter element layer comprising a second color layer 33, such as a green resin material, is uniformly coated on the entire surface of the substrate 10 by spin-coating or other applicable coating method, so as to cover the light-shielding elements 20 and the first color elements 30 and to fill the second and third openings 22b and 22c. A third imprint mask 34 is provided, which includes a second color element pattern on its imprint surface. The second color element pattern is constituted by a plurality of recess regions 36 and a plurality of protrusion regions 38. The recess region 36 corresponds to the first and second openings 22a and 22b and their adjacent light-shielding elements 20, and the protrusion region 38 corresponds to the third opening 22c.

Subsequently, the imprint surface of the second imprint mask 34 is imprinted downwardly onto the second color 33, such that the second color 33 forms two regions with different thicknesses. Referring to FIG. 3B, the first region 331 with a greater thickness corresponds to the recess region 36 and fills the second opening 22b. The second region 332 with a smaller thickness corresponds to the protrusion regions 38 and is disposed in the third opening 22c.

Finally, a third dry etching process is performed to remove the second region 332 of the second color layer 33 in the third opening 22c until the substrate 10 is exposed. This procedure simultaneously removes the top portion of the second color layer 33, in the first region 331, on the light-shielding elements 20, and on the first color elements 30. Thus, the first regions 331 remaining in the second openings 22b constitute second color elements 40 as shown in FIG. 3C. In the third dry etching, the etching stop point can be designed according to the brightness of the first color element 30 and the second color element 40. The preferable operation conditions are: $O_3$ plasma ashing, the etching time is 50-70 sec, the etching thickness is about 0.3-0.5 μm, the thickness of the second color elements 40 are 0.8 to 3.5 μm.

Figure 4A:
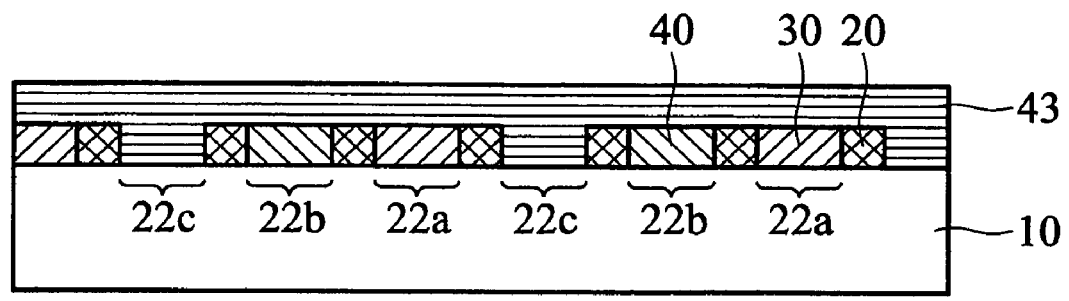
FIGS. 4A and 4B are cross-sections illustrating the process flow of third color elements according to the first embodiment of the present invention.
Figure 4B:
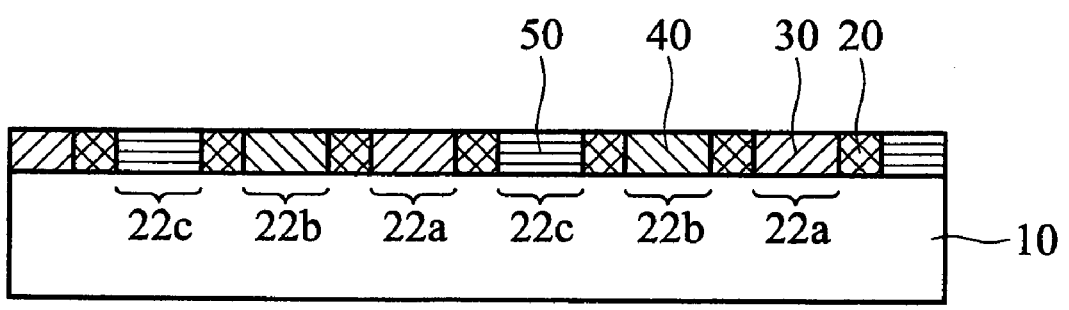

FIGS. 4A and 4B are cross-sections illustrating the process flow of fabricating third color elements of the first embodiment of the present invention. Referring to FIG. 4A, a fourth filter element layer comprising a third color layer 43, such as a blue resin material, is uniformly coated on the entire surface of the substrate 10 by spin-coating or other applicable coating method, so as to cover the light-shielding element 20, the first color elements 30 and the second color element 40, and to fill the third openings 22c.

Subsequently, a fourth dry etching process is performed to remove the third color layer 43 until the light-shielding elements 20, the first color elements 30 and the second color elements 40 are exposed. Thus, the third color layer 43 remaining in the third openings 22c constitutes third color elements 50 as shown in FIG. 4B. In the fourth dry etching, the etching stop point can be designed according to the brightness of the first, second and third color elements 30, 40 and 50. The preferable operation conditions are: $O_3$ plasma ashing, the etching time is 50-70 sec, the etching thickness is about 0.3-0.5 μm, the thickness of the third color elements 50 are 0.8 to 3.5 μm.

Alternatively, the fourth dry etching process can be replaced or followed by polishing to planarize the surface of the color filter. That is, the third color layer 43 is directly polished until the light-shielding element 20, the first and second color elements 30 and 40 are exposed. By polishing, the surface flatness of the first, second, and third color elements 30, 40 and 50 can be further improved, thus attaining better resolution.

The Second Embodiment

The color filter process of the second embodiment of the present invention only includes fabrication of three kinds of color elements, omitting the additional black matrix. FIGS. 5 to 7 are cross-sections illustrating the process flow of fabricating the color filter of the second embodiment of the present invention.

Figure 5A:
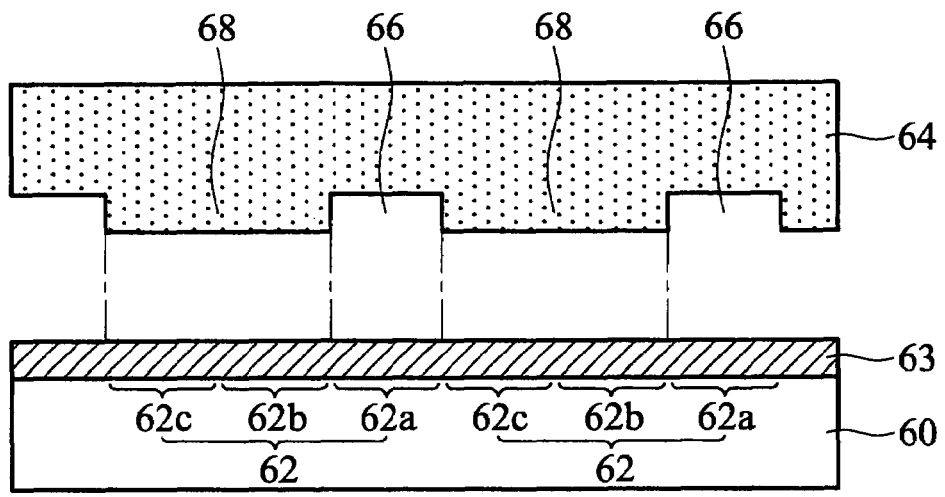
FIGS. 5A to 5C are cross-sections illustrating the process flow of first color elements according to the second embodiment of the present invention.
Figure 5B:
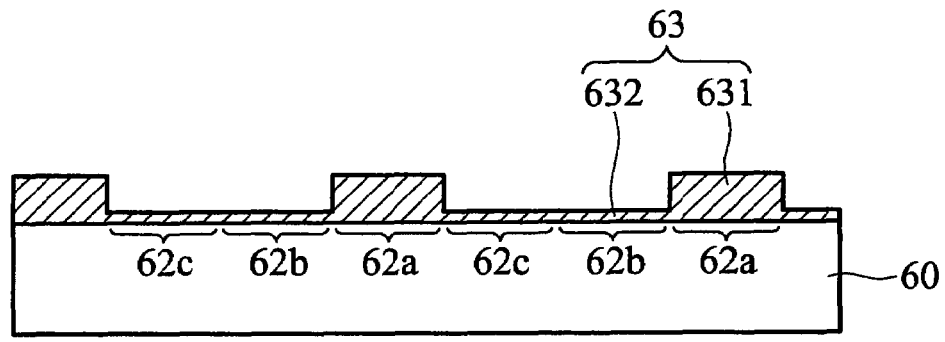
Figure 5C:
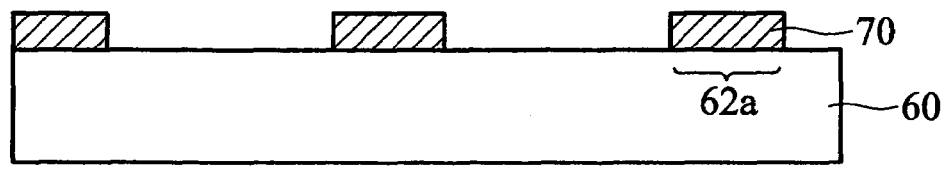

FIGS. 5A to 5C are cross-sections illustrating the process flow of fabricating first color elements of the second embodiment of the present invention. Referring to FIG. 5A, a substrate 60 is provided, which is a transparent insulating substrate, a glass substrate, a color filter substrate or a TFT (thin film transistor) array substrate applied in a liquid crystal display. A plurality of opening groups 62 is defined on the substrate 60. Each opening group 62 includes first, second and third opening regions 62a, 62b and 62c. The first opening region 62a corresponds to a place for a first color element to be formed, the second opening region 62b corresponds to a place for a second color element to be formed, and the third opening region 62c corresponds to a place for a third color element to be formed.

Subsequently, a first filter element layer comprising a first color layer 63, such as a red resin material, is uniformly coated on the entire surface of the substrate 60 by spin-coating or other applicable coating method. A first imprint mask 64 is provided, which includes a first color element pattern on its imprint surface. The first color element pattern is constituted by a plurality of recess regions 66 and a plurality of protrusion regions 68. The recess region 66 corresponds to the first opening region 62a, and the protrusion region 68 corresponds to the second and third opening regions 62b and 62c. The first imprint mask 64 can be formed by subjecting a quartz board to electron beam direct writing or by subjecting a metal board to mechanical processing.

Subsequently, the imprint surface of the first imprint mask 64 is imprinted downwardly onto the first color layer 63, such that the first color layer 63 forms two regions with different thicknesses. Referring to FIG. 5B, the first region 631 with a greater thickness corresponds to the recess region 66 and is disposed in the first opening region 62a. The second region 632 with a smaller thickness corresponds to the protrusion region 68 and is disposed in the second and third opening regions 62b and 62c.

Finally, a first dry etching process is performed to remove the second regions 632 of the first color layer 63 in the second and third opening regions 62b and 62c until the substrate 60 is exposed. This procedure simultaneously removes the top portion of the first regions 631 of the first color layer 63. Thus, the first regions 631 remaining in the first opening regions 62a constitute first color elements 70 as shown in FIG. 5C. The preferable operation conditions of the first dry etching are: $O_3$ plasma ashing, the etching time is 50-70 sec, the etching thickness is about 0.3-0.5 μm, the thickness of the first color elements 70 are 0.8 to 3.5 μm.

Figure 6A:
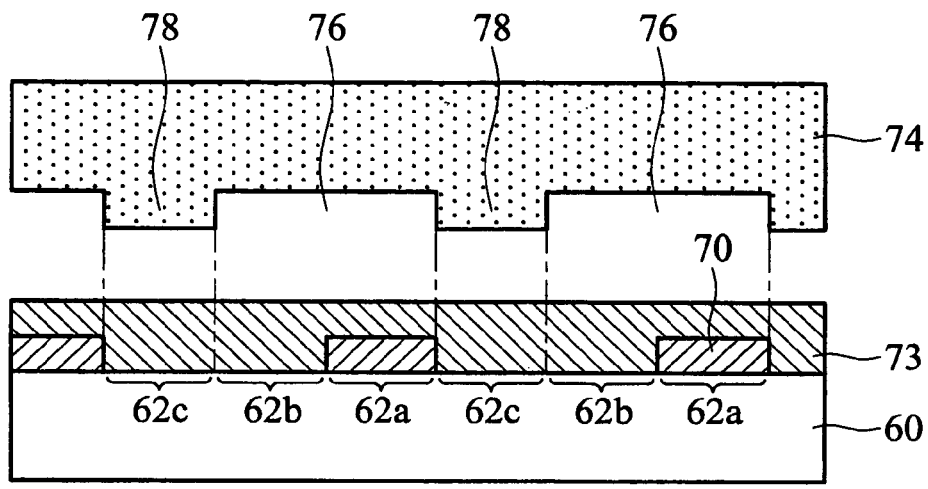
FIGS. 6A to 6C are cross-sections illustrating the process flow of second color elements according to the second embodiment of the present invention.
Figure 6B:
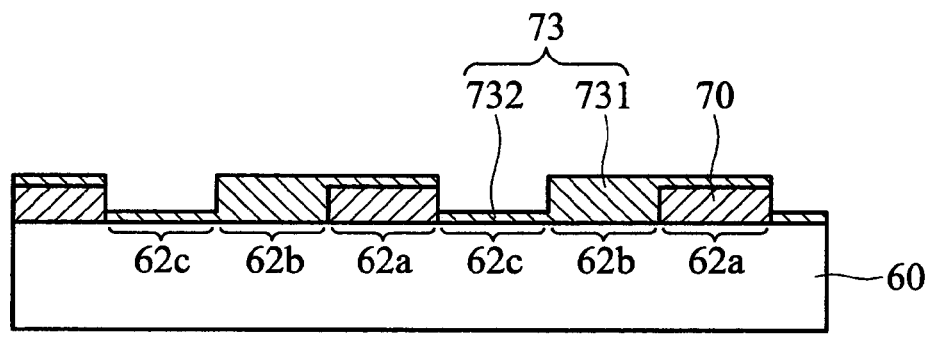
Figure 6C:
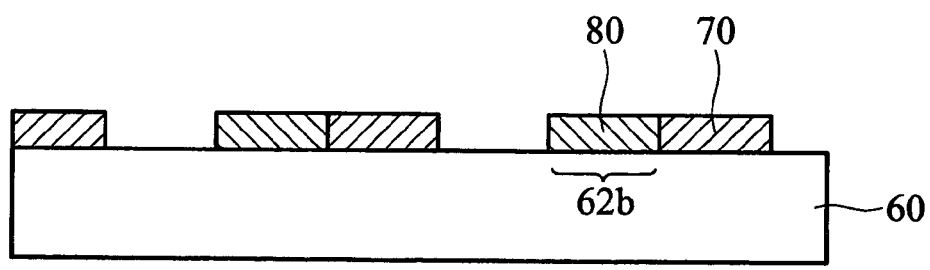

FIGS. 6A to 6C are cross-sections illustrating the process flow of fabricating second color elements of the second embodiment of the present invention. Referring to FIG. 6A, a second filter element layer comprising a second color layer 73, such as a green resin material, is uniformly coated on the entire surface of the substrate 60 by spin-coating or other applicable coating method, so as to cover the first color elements 70 and to form in the second and third opening regions 62b and 62c. A second imprint mask 74 is provided, which includes a second color element pattern on its imprint surface. The second color element pattern is constituted by a plurality of recess regions 76 and a plurality of protrusion regions 78. The recess region 76 corresponds to the first and second opening regions 62a and 62b, and the protrusion region 78 corresponds to the third opening region 62c.

Subsequently, the imprint surface of the second imprint mask 74 is imprinted downwardly onto the second color layer 73, such that the second color layer 73 forms two regions with different thicknesses. Referring to FIG. 6B, the first region 731 with a greater thickness corresponds to the recess region 76 and is disposed in the second opening region 62b. The second region 732 with a smaller thickness corresponds to the protrusion region 78 and is disposed in the third opening region 62c.

Finally, a second dry etching process is performed to remove the second regions 732 of the second color layer 73 in the third opening regions 62c until the substrate 60 is exposed. This procedure simultaneously removes the top portion of the second color layer 73 in the first regions 731 and on the first color elements 70. Thus, the first regions 731 remaining in the second opening regions 62b constitute second color elements 80 as shown in FIG. 6C. In the second dry etching, the etching stop point can be designed according to the brightness of the first color elements 70 and the second color elements 80. The preferable operation conditions are: $O_3$ plasma ashing, the etching time is 50-70 sec, the etching thickness is about 0.3-0.5 μm, the thickness of the second color elements 80 are 0.8 to 3.5 μm.

Figure 7A:
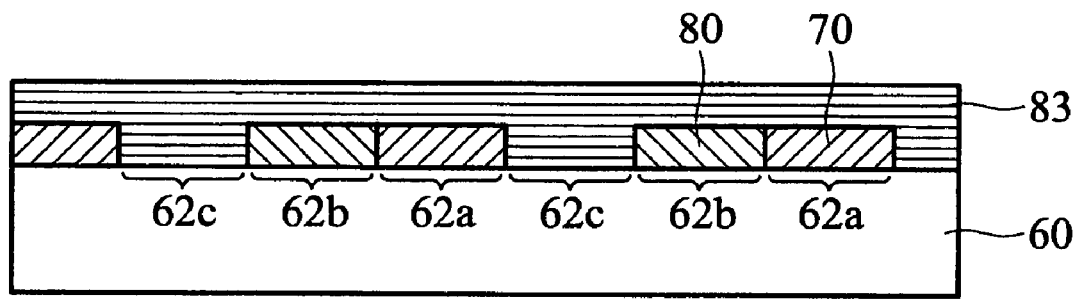
FIGS. 7A and 7B are cross-sections illustrating the process flow of third color elements according to the second embodiment of the present invention.
Figure 7B:
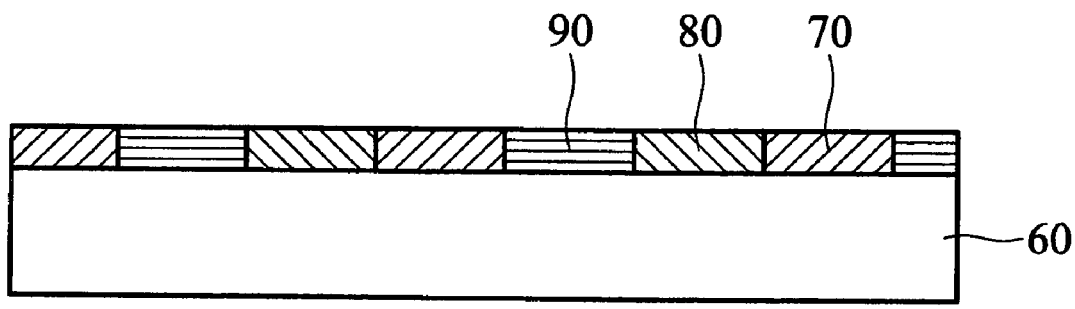

FIGS. 7A and 7B are cross-sections illustrating the process flow of fabricating third color elements of the second embodiment of the present invention. Referring to FIG. 7A, a third filter element layer comprising a third color layer 83, such as a blue resin material, is uniformly coated on the entire surface of the substrate 60 by spin-coating or other applicable coating method, so as to cover the first and second color elements 70 and 80 and to form in the third opening regions 62c.

Subsequently, a third dry etching process is performed to remove the third color layer 83 until the first and second color elements 70 and 80 are exposed. Thus, the third color layer 83 remaining in the third opening regions 62c constitutes third color elements 90 as shown in FIG. 7B. In the third dry etching, the etching stop point can be designed according to the brightness of the first, second and third color elements 70, 80 and 90. The preferable operation conditions are: $O_3$ plasma ashing, the etching time is 50-70 sec, the etching thickness is about 0.3-0.5 μm, the thickness of the third color elements 90 are 0.8 to 3.5 μm.

Alternatively, the third dry etching process can be replaced or followed by polishing. That is, the third color layer 83 is directly polished until the first and second color elements 70 and 80 are exposed. By polishing, the surface flatness of the first, second, and third color elements 70, 80 and 90 can be further improved, thus attaining better resolution.

Figure 8:
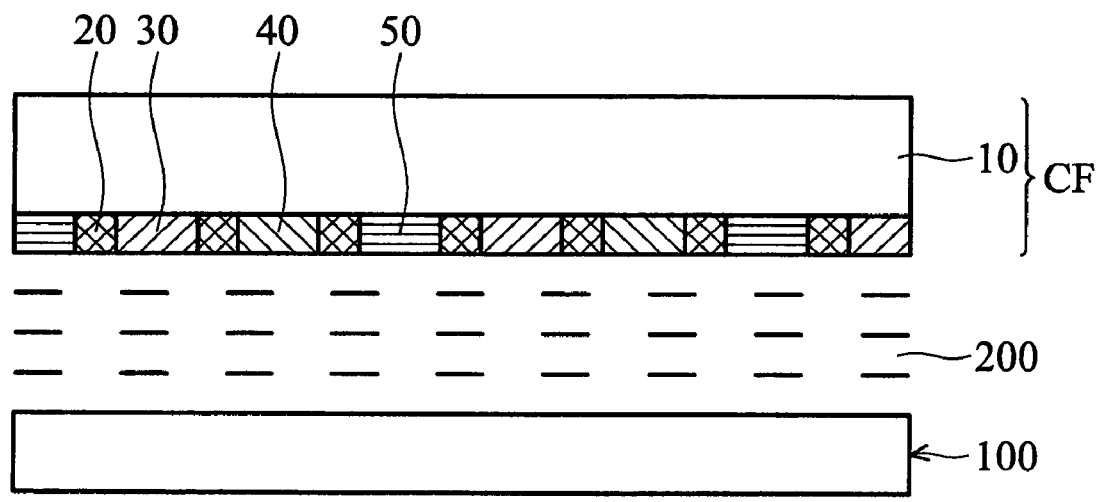
FIG. 8 is a cross-section of a liquid crystal display panel, incorporating the color filter configuration in accordance with the present invention.

FIG. 8 is a cross-section of a liquid crystal display panel of the present invention. The LCD panel 1 includes a first substrate CF, a second substrate 100, and a liquid crystal layer 200 interposed between the first substrate CF and the second substrate 100. The second substrate 100 can be a TFT (thin film transistor) array substrate on which a TFT (not shown) is formed. The first substrate CF can be a color filter fabricated by the process of the present invention, for example, the color filter of FIG. 4B, including a black matrix 20, the first, second, and third color elements 30, 40 and 50 or FIG. 7B (without the black matrix). Detailed descriptions for forming the color filter of FIG. 4B are omitted.

Figure 9:
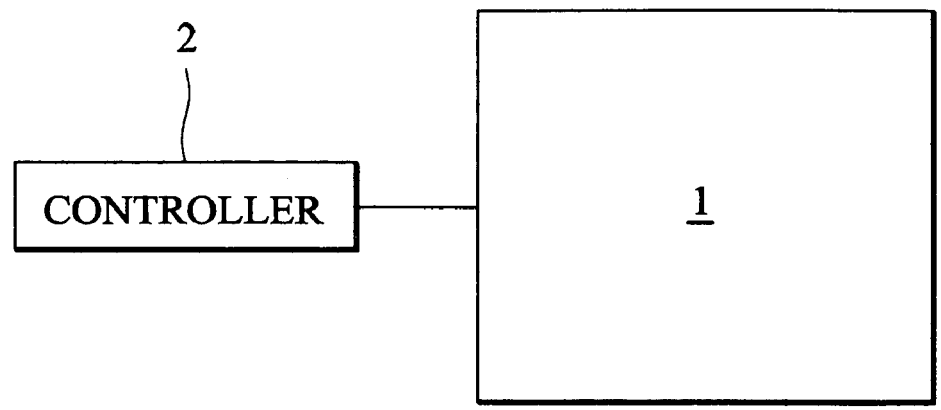
FIG. 9 is a schematic diagram illustrating a LCD device, incorporating the color filter configuration in accordance with the present invention.

FIG. 9 is a schematic diagram illustrating a LCD device incorporating the LCD panel 1 of FIG. 8. The LCD panel 1 as shown in FIG. 8 is coupled to a controller 2 to form a liquid crystal display device 3. The controller 2 can comprise a source and gate driving circuits (not shown) to control the LCD panel 1 to render image in accordance with an input.

Figure 10:
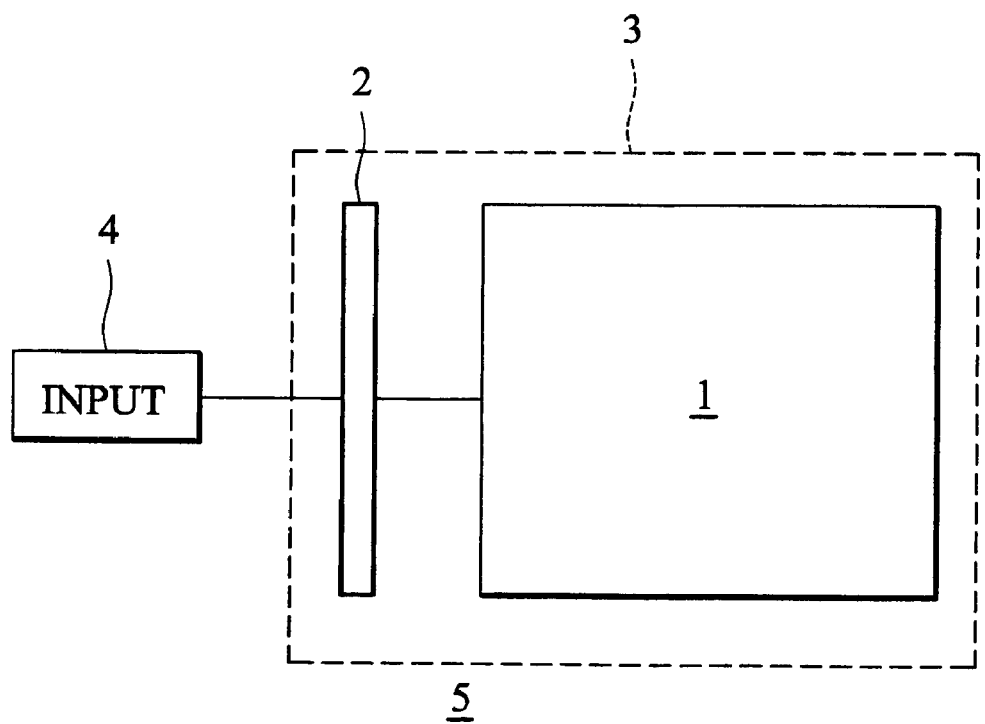
FIG. 10 is a schematic diagram illustrating an electronic device, incorporating the color filter configuration in accordance with the present invention.

FIG. 10 is a schematic diagram illustrating an electronic device incorporating the LCD device 3 shown in FIG. 9. An input device 4 is coupled to the controller 2 of the LCD device 3 shown in FIG. 9 to form an electronic device 5. The input device 4 can include a processor or the like to input data to the controller 2 to render an image. The electronic device 5 may be a portable device such as a PDA, notebook computer, tablet computer, cellular phone, or a display monitor device, or non-portable device such as a desktop computer.

The foregoing description of the preferred embodiments of this invention has been presented for purposes of illustration and description. Obvious modifications or variations are possible in light of the above teaching. The embodiments chosen and described provide an excellent illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A process for fabricating a color filter, comprising steps of:
   providing a substrate;
   forming a first filter element layer on the substrate;
   stamping the first filter element layer to form a first array of openings, wherein the first array of openings include a residual layer of the first filter element layer at the bottom of the openings after stamping;
   removing the residual layer; and
   filling the first array of openings with a second filter element layer, whereby the color filter comprises the first and second filter element layers.

2. The process of claim 1, wherein the first and second filter element layers each comprises at least one of a light-shielding layer and a first color layer.

3. The process of claim 1, wherein the removing step comprises a step of etching.

4. The process of claim 1, further comprising a planarizing step for planarizing the first and second filter element layers.

5. The process of claim 4, wherein the planarizing step comprises a step of polishing the first and second filter element layers.

6. The process of claim 1, further comprising steps of:
   stamping the second fitter element layer to form a second ray of openings; and
   filling the second array of openings with a third filter element layer, wherein the third filter element layer comprises a second color layer,
   whereby the color filter comprises the first, second and third filter element layers.

7. The process of claim 6, further comprising steps of:
   stamping the third filter element layer to form a third ray of openings; and filling the third array of openings with a fourth filter element layer, wherein the fourth filter element layer comprises a third color layer, whereby the color filter comprises the first, second, third and fourth filter element layers.

8. The process of claim 1, wherein the step of stamping comprises steps of:

providing an imprint mask including at least one recess region and at least one protrusion region on its imprint surface; and imprinting the imprint surface of the imprint mask onto the first filter clement layer to form the first array of openings, shapes of openings being corresponding to a shape of the protrusion region in the imprint mask.

9. The process of claim 1, wherein the substrate is a transparent insulating substrate, a glass substrate, or a thin film transistor array substrate.

10. A process for fabricating a liquid crystal display panel, comprising the following steps:

providing a first substrates;

forming a first filter element layer on the first substrate;

stamping the first filter clement layer to form a first array of openings, wherein the first array of openings include a residual layer of the first filter element layer at the bottom of the openings after stamping;

removing the residual layer;

filling the first array of openings with a second filter element layer, whereby the color filter comprises the first and second filter element layers;

providing a second substrate; and interposing a liquid crystal layer between the first and second substrates.

11. The process of claim 10, wherein the first and second filter element layers each comprises at least one of a light-shielding layer and a first color layer.

12. The process of claim 10, wherein the removing step comprises a step of etching.

13. The process of claim 10, further comprising a planarizing step for planarizing the first and second filter element layers.

14. The process of claim 10, further comprising steps of:

stamping the second filter element layer to form a second array of openings; and filling the second array of openings with a third filter element layer, wherein the third filter element layer comprises a second color layer, whereby the color filter comprises the first, second and third filter element layers.

15. The process of claim 14, further comprising steps of:

stamping the third filter element layer to form a third array of openings; and filling the third array of openings with a fourth filter element layer, wherein the fourth filter element layer comprises a third color layer, whereby the color filter comprises the first, second, third and fourth filter element layers.

16. The process of claim 10, wherein the step of stamping comprises steps of:

providing an imprint mask including at least one recess region and at least one protrusion region on its imprint surface; and imprinting the imprint surface of the imprint mask onto the first filter element layer to form the first array of openings, shapes of openings being corresponding to a shape of the protrusion region in the imprint mask.

17. The process of claim 10, wherein the substrate is a transparent insulating substrate, a glass substrate, or a thin film transistor array substrate.

* * * * *